United States Patent
Schlapbach

(10) Patent No.: US 8,614,905 B2
(45) Date of Patent: Dec. 24, 2013

(54) VOLTAGE CONVERTING APPARATUS AND METHOD FOR CONVERTING A VOLTAGE

(75) Inventor: Ulrich Schlapbach, Liebefeld (CH)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 13/704,181

(22) PCT Filed: Nov. 17, 2010

(86) PCT No.: PCT/EP2010/067701
§ 371 (c)(1),
(2), (4) Date: Dec. 13, 2012

(87) PCT Pub. No.: WO2011/160729
PCT Pub. Date: Dec. 29, 2011

(65) Prior Publication Data
US 2013/0114317 A1    May 9, 2013

Related U.S. Application Data

(60) Provisional application No. 61/357,683, filed on Jun. 23, 2010.

(51) Int. Cl.
*H02M 7/5387* (2007.01)
(52) U.S. Cl.
USPC ........ 363/132; 363/40; 363/56.02; 363/56.05
(58) Field of Classification Search
USPC ............. 363/40, 41, 55, 56.01, 56.02, 56.03, 363/56.04, 56.05, 95, 98, 131, 132
See application file for complete search history.

(56) References Cited

U.S. PATENT DOCUMENTS

| | | | |
|---|---|---|---|
| 5,946,178 A * | 8/1999 | Bijlenga | 361/91.5 |
| 6,377,107 B1 | 4/2002 | Franck | |
| 6,995,994 B2 * | 2/2006 | Bijlenga et al. | 363/51 |
| 2012/0092912 A1 * | 4/2012 | Eckel | 363/123 |

FOREIGN PATENT DOCUMENTS

| | | |
|---|---|---|
| DE | 19539554 C1 | 1/1997 |
| DE | 19933161 A1 | 1/2001 |
| DE | 10103031 A1 | 7/2002 |
| WO | WO 2007/023064 A1 | 3/2007 |

* cited by examiner

*Primary Examiner* — Nguyen Tran

(74) *Attorney, Agent, or Firm* — Birch, Stewart, Kolasch & Birch, LLP

(57) ABSTRACT

A voltage converting apparatus includes a series connection of at least four switching elements each including at least one semiconductor device of turn-off type and a free-wheeling diode connected in anti-parallel therewith. The apparatus has a device configured to measure a parameter representative of the voltage across each free-wheeling diode when turned off and an arrangement configured to control the amount of charge stored in each diode at the moment the diode is turned-off by stopping to conduct depending upon the results of the measurement carried out by the device for controlling the voltage across the diode after turn-off thereof.

20 Claims, 6 Drawing Sheets

VOLTAGE CONVERTING APPARATUS AND METHOD FOR CONVERTING A VOLTAGE

CROSS REFERENCE TO RELATED APPLICATIONS

This non-provisional application is a National Stage entry under U.S.C. §371 of International Application No. PCT/EP2010/067701 filed on Nov. 17, 2010, which claims the benefit of U.S. Provisional Application No. 61/357,683 filed on Jun. 23, 2010. The entire contents of all of the above applications are hereby incorporated by reference.

TECHNICAL FIELD OF THE INVENTION AND BACKGROUND ART

The present invention relates to a voltage converting apparatus comprising a series connection of at least four switching elements each comprising at least one semiconductor device of turn-off type and a free-wheeling diode connected in anti-parallel therewith, opposite ends of said series connection being configured to be connected to different potentials resulting in a direct voltage across said series connection and a mid point of the series connection being configured to be connected to an alternating voltage side of the apparatus while dividing the series connection in two halves, said apparatus further comprising a control unit configured to control said semiconductor devices of the switching elements for obtaining a determined alternating voltage on said alternating voltage side of the apparatus, as well as a method for converting a voltage according to the preamble of the appended independent method claim.

The invention is applicable to any voltage converting apparatus having these features and neither restricted to any levels of voltages, currents or powers to be handled by such an apparatus, although the invention is particularly directed to high voltage applications, which here means a direct voltage across said series connection exceeding 1 kV and often exceeding 50 kV. The reason for connecting at least two said switching elements and by that at least two semiconductor devices in series in each said half of said series connection is in fact to obtain high voltage switching capability, since the semiconductor devices connected in series, and also the free-wheeling diodes connected in anti-parallel therewith may then share the voltage to be taken by switching elements connected in series and belonging to the same half in a blocking state of these switching elements.

One example of a known voltage converting apparatus according to the invention in the form of a Voltage Source Converter is schematically shown in FIG. 1. Such a converter has normally three phase legs, but only one phase leg 1 is shown in FIG. 1 and has here a series connection of four switching elements 2-5 each comprising a semiconductor device 6 of turn-off type, such as an IGBT, and a free-wheeling diode 7 connected in anti-parallel therewith. Opposite ends of the series connection are connected to direct voltage poles 8, 9 on different potentials resulting in a direct voltage across the series connection. A mid point 10 of the series connection is configured to be connected to an alternating voltage side, here in the form of an alternating voltage network 11. A control unit 12 is configured to control the semiconductor devices of the switching elements for obtaining a determined alternating voltage on the alternating voltage side of the apparatus, such as direct voltage pulses according to a Pulse Width Modulation pattern or any other control method.

The number of switching elements connected in series may in the practice be much higher than shown, such as 10-50, for increasing the voltage handling capability of the converter. The control unit will when carrying out said control turn all semiconductor devices of one half on and off substantially simultaneously, so that these will in the practice act as one single switch.

Another type of voltage converting apparatus to which the present invention is directed is schematically illustrated in FIG. 2, and this is also a Voltage Source Converter, but it differs from that according to FIG. 1 by the fact that each switching element 13 has on one hand two semiconductor assemblies 14, 15 connected in series and having each a semiconductor device 16 of turn-off type and a free-wheeling diode 17 connected in anti-parallel therewith and on the other at least one energy storing capacitor 18. The control unit 19 is configured to control the semiconductor devices of said switching element to obtain two switching states, namely a first switching state and a second switching state, in which the voltage across said energy storing capacitor and a zero-voltage, respectively, is supplied across the two terminals 20, 21 of the switching element for obtaining a determined alternating voltage on the alternating voltage side 22 of the apparatus. A Voltage Source Converter of this type is disclosed for instance in DE 101 03 031 A1 and WO2007/023064 A1 and is normally called a multi-cell converter or M2LC.

A problem in common to these and other voltage converting apparatuses of the type defined in the introduction is to obtain a uniform distribution of the voltage to be taken by a series connection of switching elements on these switching elements. It is important to take measures for obtaining this for reducing transfer losses and avoiding failure of switching elements or the entire apparatus. The reason for the occurrence of different voltages across such switching elements connected in series may be charge differences in the semiconductor devices of the switching elements due to temperature difference or due to semiconductor like time differences. Furthermore, switching delay due to signal transmission, different control voltage levels of gate units controlling the semiconductor devices or different transfer characteristics of the semiconductor devices can result in switching differences and thus voltage sharing differences. Difference in passive components not shown in the Figures may be another ground for voltage miss-sharing among the switching elements.

This problem has so far been solved by using delays when switching said semiconductor devices connected in series based on information obtained from previous switching events to compensate the voltage miss-sharing. A device having too high voltage after a switching cycle must be turned off later compared to the last turn-off cycle in respect to the other semiconductor devices connected in series therewith and connected in the same string, i.e. controlled "simultaneously". Furthermore, passive voltage sharing circuits (snubbers) are used to limit the voltage mis-sharing among the devices. The costs for such circuits in such known devices are considerable.

SUMMARY OF THE INVENTION

The object of the present invention is to provide a voltage converting apparatus of the type defined in the introduction being improved in at least some aspect with respect to such apparatuses already known.

This object is according to the invention obtained by providing such an apparatus with means configured to measure a parameter representative of the voltage across each said free-wheeling diode when turned off and an arrangement configured to control the amount of charge stored in each said diode at the moment the diode is turned off by stopping to conduct depending upon the results of said measurement carried out by said means for controlling the voltage across the diode after turn-off thereof.

It has turned out that addressing the diode voltage sharing in this way makes it possible to minimize the size of passive snubbers to compensate for worse case voltage sharing across the switching elements connected in series in each said path. The resulting charge of a diode is given by the precondition of each diode mainly influenced by temperature and initial semiconductor charge life time properties. Voltage sharing for the diodes is given inverse proportional to the stored charge, i.e. the more charge the diode has stored, the less voltage it will build up. By measuring a said parameter representative of the voltage across each free-wheeling diode when turned off and then controlling the amount of charge stored in each said diode at the moment the diode is turned off depending on the result of said measurement voltage mis-sharing among the diodes connected in series in the same string may efficiently be compensated, so that the cost and size of passive components for series connected switching elements may be remarkably reduced.

According to an embodiment of the invention said means is configured to measure the voltage across each free-wheeling diode. This constitutes a simple and reliable way of obtaining said parameter upon which said amount of charge stored in each said diode will then be controlled.

According to another embodiment of the invention said semiconductor devices have the respective free-wheeling diode built in therein. Charge control of diodes built in in such semiconductor devices of turn-off type may be accomplished by simple means.

According to another embodiment of the invention constituting a further development of the embodiment last mentioned said semiconductor devices are gate-controlled, and said arrangement is configured to apply a positive pulse on the gate of a said semiconductor device when the diode built in therein is conducting and make the properties of this pulse depending upon the results of said measurement carried out by said means. During diode current flow the gate emitter voltage of a said semiconductor device is being shifted below threshold, which mostly means to be negative, to obtain lower conduction losses. By applying a said positive gate pulse before the current is turned off charge will be removed from the diode to obtain lower turn-off losses thereof. By modifying the properties of this positive gate pulse the amount of charge stored in the respective diode at the moment the diode is turned off and by that the voltage across the diode after turn-off thereof may be controlled, specially in series connection.

According to another embodiment of the invention said arrangement is configured to control the charge stored in the respective diode at the moment it is turned off by selecting the delay between the end of said positive gate pulse and the turn-off of the diode. The amount of charge stored in the respective diode at the moment it is turned off may be efficiently adjusted in this way, since the longer this delay will be the more charge will be stored and the less voltage will be built up.

According to another embodiment of the invention said arrangement is configured to vary said time delay to be 0-30 µs or 0-15 µs. Said positive gate pulse has preferably a length of 10-15 µs or 10-30 µs.

According to another embodiment of the invention the semiconductor devices of the apparatus are RC-IGBTs, i.e. Reverse Conducting Insulated Gate Bipolar Transistors. The amount of charge stored in the diode built in in such a semiconductor device and by that the voltage across the diode at the turn-off thereof may easily be controlled, such as by modifying said time delay of a positive to negative gate voltage until the diode is turned off.

According to another embodiment of the invention the apparatus is a Voltage Source Converter having at least one phase leg formed by as said series connection of switching elements. This is an application of the present invention where the benefit of the charge control of the free-wheeling diodes is substantial. Such Voltage Source Converters may then be of different types, such as the two types disclosed in the introduction and be used in all kinds of situations, in which direct voltage is to be converted into alternating voltage and conversely, in which examples of such uses are in stations of HVDC-plants (High Voltage Direct Current), in which direct voltage is normally converted into a three-phase alternating voltage or conversely, or in so-called back-to-back stations in which alternating voltage is firstly converted into direct voltage and this is then converted into alternating voltage, as well as in SVCs (Static Var Compensator), in which the direct voltage side consists of capacitors hanging freely. However, the present invention is not restricted to these applications, but other applications are also conceivable, such as in different types of drive systems for machines, vehicles etc.

According to another embodiment of the invention said switching elements of each said half form at least one current valve, said control unit is configured to control said current valves of the converter to apply direct voltage pulses according to a Pulse Width Modulation pattern on said mid point, and said arrangement is configured to apply a said positive gate pulse to the semiconductor devices of the at least one current valve belonging to the half of said series connection in which for the moment the diodes are alternatively conducting while semiconductor devices of the other half are alternatively turned on and off.

According to another embodiment of the invention the apparatus is configured to have a direct voltage across said opposite ends of said series connection being 1 kV-1200 kV, 10 kV-1200 kV or 100 kV-1200 kV. These are intervals within which the present invention is particularly advantageous, although it is not restricted thereto.

According to another embodiment of the invention the apparatus is configured to have said opposite ends of said series connection connected to a direct voltage network for transmitting High Voltage Direct Current (HVDC) and the alternating voltage side connected to an alternating voltage phase line belonging to an alternating voltage network.

The invention also relates to a method for converting a voltage by controlling a voltage converting apparatus according to the preamble of the appended independent method claim, which is characterized by measuring a parameter representative of the voltage across each said free-wheeling diode when turned off, and controlling the amount of charge stored in each said diode at the moment the diode is turned off by stopping to conduct depending upon the results of said measurement of said parameter for controlling the voltage across the diode after turn-off thereof. The advantage of such a method and the embodiments of this method defined in the dependent claims appear clearly from the above discussion of the apparatus according to the invention and the embodiments thereof.

Further advantages as well as advantageous features of the invention will appear from the following description.

BRIEF DESCRIPTION OF THE DRAWINGS

With reference to the appended drawings, below follows a description of embodiments of the invention cited as examples.

In the drawings.

DETAILED DESCRIPTION OF EMBODIMENTS OF THE PRESENT INVENTION

Figure 3:
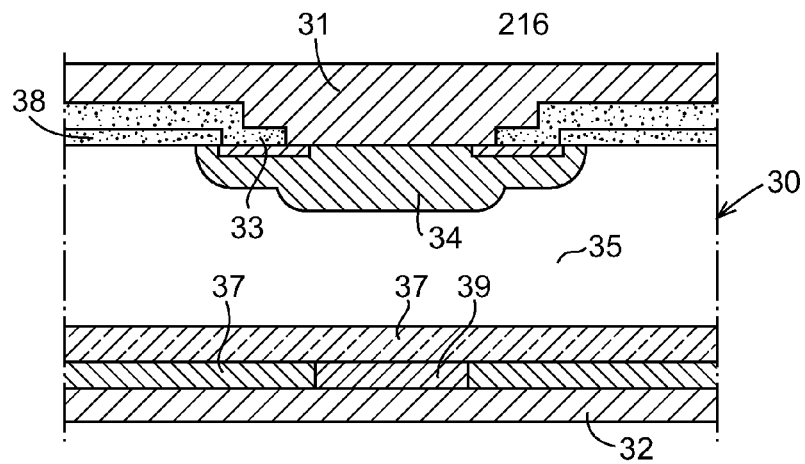
FIG. 3 is a simplified view illustrating a RC-IGBT advantageously used as semiconductor device in an apparatus according to the present invention.

A Reverse Conducting Insulated Gate Bipolar Transistor 30 suitable to form a switching element in a voltage converting apparatus according to the present invention is schematically illustrated in FIG. 3. The IGBT thereof has at one end an emitter 31 and at the other a collector 32. Furthermore, it has an N+ emitter region layer 33, a P+ body region layer 34, an N− drift layer 35, an N buffer layer 36 and a P+ collector region layer 37. Additionally, it has a gate electrode 38, and a conducting inversion channel may be formed from the layer 33 to the layer 35 below the gate 38 by applying a positive gate-emitter voltage above the on-state voltage of the IGBT.

By arranging an N+ layer 39 in contact with the collector electrode 32 beneath the layer 37 a free-wheeling diode is built in into the semiconductor device. This means that a switching element comprising a semiconductor device of turn-off type in the form of an IGBT and a free-wheeling diode connected in anti-parallel therewith may be formed by this component.

Figure 1:
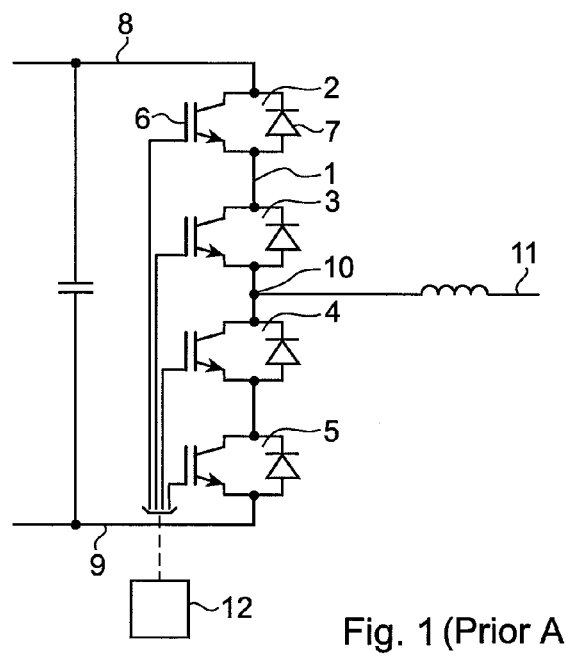
FIG. 1 is a simplified view schematically illustrating a known apparatus according to a type to which the present invention is applicable.
Figure 2:
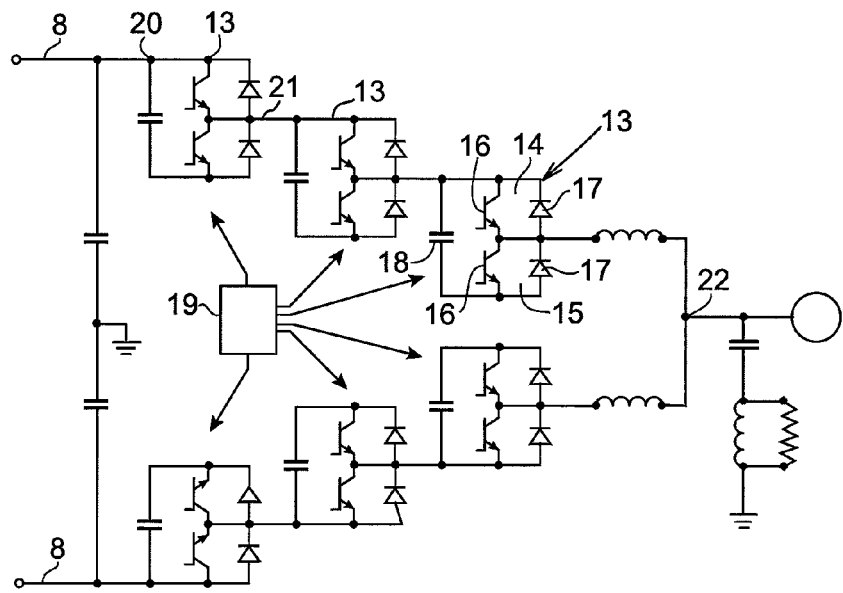
FIG. 2 is a simplified view schematically illustrating a known apparatus of another type to which the present invention is applicable.
Figure 4:
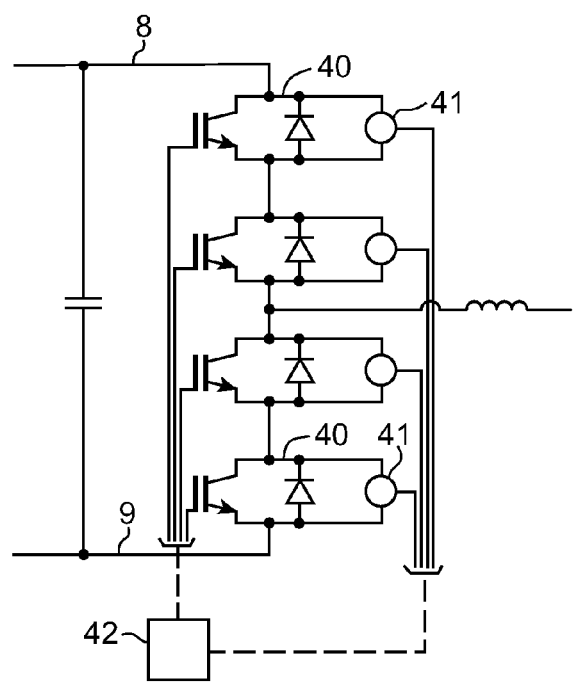
FIG. 4 is a view corresponding to FIG. 1 of an apparatus according to an embodiment of the present invention.
Figure 5:
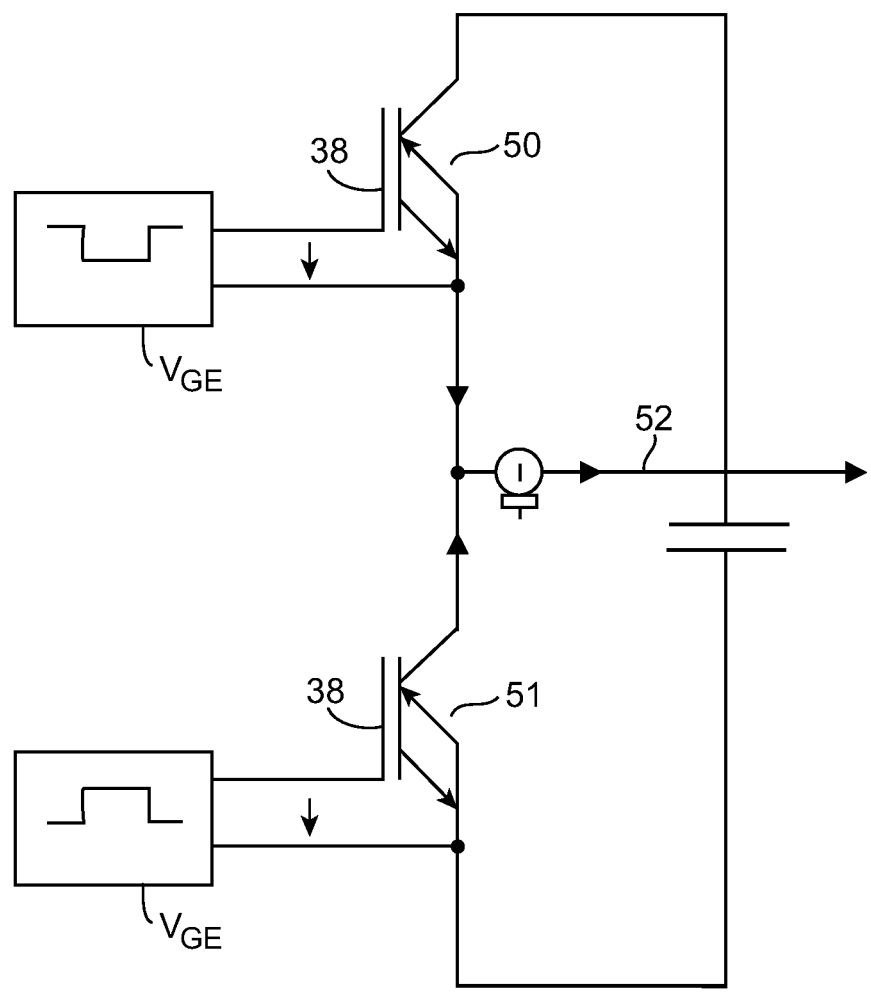
FIG. 5 is a view corresponding to FIG. 1 used to explain an apparatus and a method according to the present invention.
Figure 6:
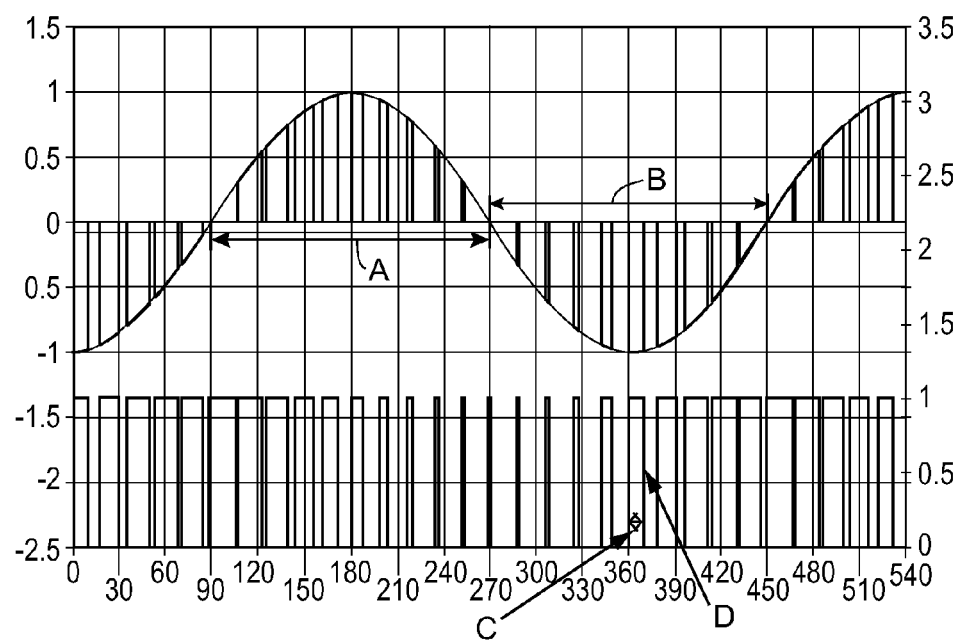
FIG. 6 is a graph illustrating the Pulse Width Modulation pattern for one half of the series connection of switching elements in FIG. 5.
Figure 7:
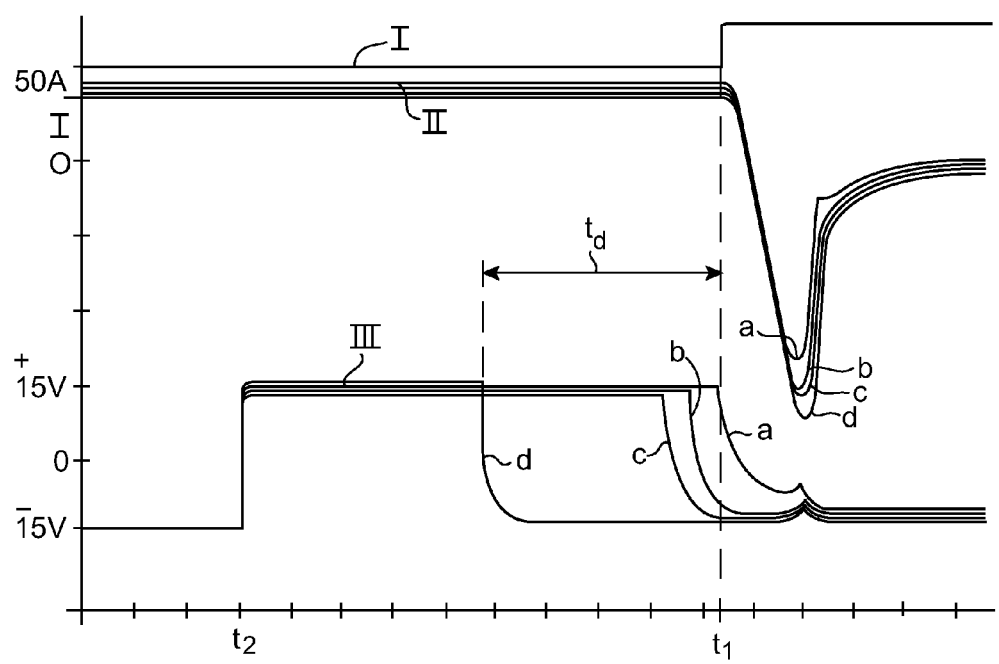
FIG. 7 is a graph illustrating the timing influence of delay control of gate-emitter voltage of one RC-IGBT versus current commutation time of such RC-IGBTs in an apparatus according to FIG. 5, and FIGS. 8 and 9 are simplified graphs of the charge of a free-wheeling diode in an RC-IGBT at the moment of turn-off of the diode versus delay between the end of a positive gate pulse and the turn-off of the diode and how a target charge may be obtained. The resulting voltage sharing between series connected devices is illustrated versus charge influence.

FIG. 4 illustrates schematically a voltage converting apparatus according to the present invention. This apparatus is of the type shown in FIG. 1 and has RC-IGBTs 40 connected in series as switching elements. The apparatus comprises means 41 configured to measure the voltage across each free-wheeling diode of each switching element when turned off and to send information thereabout to said control unit 42, which includes an arrangement configured to control the amount of charge stored in each said diode at the moment the diode is turned off by stopping to conduct depending upon the results of the measurement carried out by said voltage measuring means 41 for controlling the voltage across the diode after turn-off thereof. The apparatus shown in FIG. 4 is summarized in FIG. 5, in which the symbols 50 and 51 may each stand for a high number of RC-IGBTs connected in series. During half a period of the alternating voltage created on the alternating voltage side 52 of the apparatus the IGBTs in the switching elements 50 will be alternatively turned on and off according to a Pulse Width Modulation pattern and the diodes in the switching elements 51 will conduct when the IGBTs in the switching elements 50 are turned off. The voltage pulses for a RC-IGBT of the upper half 50 is shown at the bottom of FIG. 6, in which the pulses within the time period A is when the IGBT thereof is conducting and during the time period B when the diode thereof is conducting. Controlling the voltage across the diode of the switching elements after turn-off of the diode for obtaining uniform voltage sharing of the diodes connected in series is possible during the time of conduction of the respective diode during the time period B as illustrated through the arrow C in FIG. 6 standing for one total available period for charge control ending at D. How this may take place will now be explained while also referring to FIG. 7. The line I shows the gate-emitter voltage $V_{GE}$ of the IGBTs in the switching elements of the half, here the lower half, of the phase leg in the period when these are alternatively turned on and off, and these IGBTs are turned on at the point of time $t_1$, which means that the current II through a diode in a switching element of the upper half will then be commutated, so that the current will flow to the alternating voltage side 52 through the lower IGBTs instead. The gate emitter voltage $V_{GE}$ of a switching element in the upper path 50 is illustrated at the bottom of FIG. 7. During diode current flow this gate emitter voltage is being shifted to be below threshold and in the present case −15 V to obtain lower conduction losses. However, shortly before the current is turned off, namely at the point of time $t_2$, which may be in the order of 20 μs before $t_1$, a quick positive gate pulse III is issued to remove as much charge as possible from that semiconductor device to obtain lower turn-off losses. This positive gate pulse has to be removed before the time $t_1$, and the residual charge extracted during diode turn-off depends on the time that elapsed between the moment when the positive gate pulse is removed until the current is really commutated away from the device. It is shown how this delay may be zero (a), 1 μs (b), 4 μs (c) and 12 μs (d) and how this will influence the current (a-d). It appears that the reverse recovery current increases with the delay and is substantially higher for the delay according to d than the one according to a (a=zero delay). The reason for this is that with a positive gate-emitter voltage applied, as through the positive gate pulse III, charge is extracted and the charge stored is reduced. This happens very quickly within μs range. If then the gate-emitter voltage is reduced below threshold, typically 0 V or negative voltage (here −15 V) the charge starts to accumulate again during a time period ranging from few μs up to several hundreds μs until the full charge is achieved again.

The voltage sharing of diodes connected in series is given inverse proportional to the stored charge. The more charge a diode has stored, the less voltage it will build up. This means that the voltage sharing may efficiently be controlled and adjusted by modifying said delay and by that the charge stored for the respective diodes in accordance with the actual voltage there-across determined in the previous switching period. In addition the stored charge dictates the residual current flow for all other diodes (semiconductor devices) in the same string. It has to be remembered that the current through each device has to be the same, so that the voltage sharing depends on the voltage needed in each diode to generate the required charge.

Figure 8:
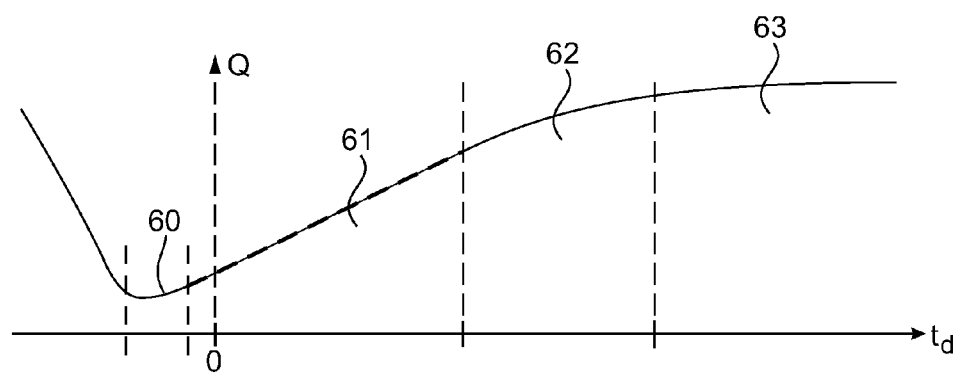

FIG. 8 is a graph of the charge Q stored in a diode of an RC-IGBT in a series connection of such devices at the moment the diode is turned off versus the time delay time $t_d$, which is in FIG. 7 indicated for the delay d. $t_d$ may never be noticeably negative, since that would result in a phase short circuit, so that 60 is a forbidden area for the same time delay. Furthermore, it appears that in the area 61 of a comparatively short time delay, which is in the order of –2-20 µs, there will be the strongest change ratio of time delay shift versus change of charge stored, so that this is a preferred control area for voltage sharing control. The area 62 following thereupon is an area of reduced influence and the area 63 an area of negligible influence.

Figure 9:
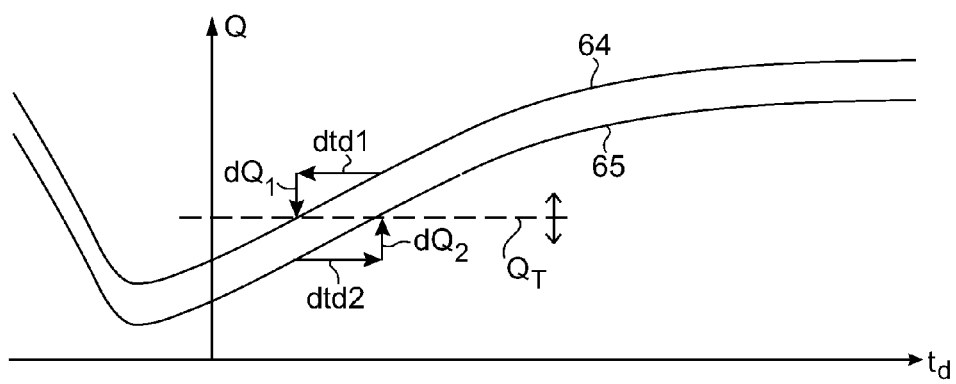

FIG. 9 is a graph corresponding to FIG. 8 for two series connected RC-IGBTs with different charge characteristics and shows how the difference in time delay $t_d$ may be used to compensate the charge difference within the given control range for obtaining the same target charge $Q_T$ for both diodes and by that a perfect voltage sharing thereof. A first of the diodes with a lower voltage thereacross has the characteristic curve 64, whereas a second of the diodes with a higher voltage thereacross has a characteristic according to the curve 65. By shortening the delay for the first diode by dtd1 the charge stored will be reduced by $dQ_1$ and by that the voltage thereacross will be increased. By increasing the delay by dtd2 for the second diode the charge stored will be increased by dQ2 and by that the voltage over that diode lowered, so that the voltage will be the same across the two diodes connected in series.

The invention is of course not in any way restricted to the embodiments described above, but many possibilities to modifications thereof would be apparent to a person with ordinary skill in the art without departing from the scope of the invention as defined in the appended claims.

Another parameter representative of the voltage across said free-wheeling diodes than this voltage may be measured, such as any parameter depending upon that voltage.

The invention is also applicable to other semiconductor devices than RC-IGBTs, and the idea will also function for a charge controllable free-wheeling diode separated from said semiconductor device of turn-off type.

The voltage converting apparatus according to the present invention may have two or more parallel strings of at least two said switching elements connected in series.

The invention claimed is:

1. A voltage converting apparatus comprising
a series connection of at least four switching elements, each comprising
at least one semiconductor device of turn-off type and a free-wheeling diode connected in anti-parallel therewith,
where opposite ends of said series connection are configured to be connected to different potentials resulting in a direct voltage across said series connection, and
a mid point of the series connection being configured to be connected to an alternating voltage side of the apparatus while dividing the series connection in two halves,
a control unit configured to control said semiconductor devices of the switching elements for obtaining a determined alternating voltage on said alternating voltage side of the apparatus, and
a measuring device configured to measure a parameter representative of the voltage across each said free-wheeling diode when being turned-off,
wherein
said semiconductor devices are gate-controlled and have the respective free-wheeling diode built in therein,
said control unit comprises an arrangement configured to control the amount of charge stored in each said free-wheeling diode at the moment the free-wheeling diode stops to conduct thereby being turned-off, depending upon the results of said measurement carried out by said measuring device for measuring the parameter when being turn-off through applying a positive pulse on the gate of a said semiconductor device when the free-wheeling diode built in therein is conducting and making the properties of the positive pulse depending upon the results of said measurement carried out by said measuring device.

2. The voltage converting apparatus according to claim 1, wherein said measuring device is configured to measure the voltage across each free-wheeling diode.

3. The voltage converting apparatus according to claim 1, wherein said arrangement is configured to control the charge stored in the respective free-wheeling diode at the moment the respective free-wheeling diode is turned-off by selecting the delay between the end of said positive gate pulse and the turn-off of the free-wheeling diode.

4. The voltage converting apparatus according to claim 1, wherein the semiconductor devices thereof are Reverse Conducting Insulated Gate Bipolar Transistors (RC-IGBTs).

5. The voltage converting apparatus according to claim 1, wherein the voltage converting apparatus is a voltage source converter having at least one phase leg formed by a said series connection of switching elements.

6. The voltage converting apparatus according to claim 5, wherein said switching elements of each said half form at least one current valve, that said control unit is configured to control said current valves of the converter to apply direct voltage pulses according to a pulse width modulation pattern on said mid point, and that said arrangement is configured to apply a said positive gate pulse to the semiconductor de-vices of the at least one current valve belonging to the half of said series connection in which for the moment the free-wheeling diodes are alternatively conducting while semiconductor devices of the other half are alternatively turned on and off.

7. The voltage converting apparatus according to claim 5, wherein the direct voltage across said opposite ends of said series connection is 1 kV-1200 kV, 10 kV-1200 kV or 100 kV-1200 kV.

8. The voltage converting apparatus according to claim 5, wherein said opposite ends of said series connection are connected to a direct voltage network for transmit-ting High Voltage Direct Current (HVDC) and the alternating voltage side is connected to an alternating voltage phase line belonging to an alternating voltage network.

9. A method for converting a voltage by controlling a voltage converting apparatus comprising a series connection of at least four switching elements each comprising at least one semiconductor device of turn-off type and a free-wheeling diode connected in anti-parallel therewith being gate-controlled having the respective free-wheeling diode built in therein, where opposite ends of said series connection being configured to be connected to different potentials resulting in a direct voltage across said series connection and a mid point of the series connection being configured to be connected to an alternating voltage side of the apparatus while dividing the series connection in two halves, in which said semiconductor devices of the switching elements are controlled for obtaining a determined alternating voltage on said alternating voltage side of the apparatus, said method comprising the steps of:
measuring a parameter representative of the voltage across each said free-wheeling diode when being turned-off, and
controlling the amount of charge stored in each said free-wheeling diode at the moment the free-wheeling diode stops to conduct thereby being turned off, said controlling depending upon the results of said measurement of said parameter representative of the voltage across the free-wheeling diode when being turned-off through applying a positive pulse on the gate of a said semiconductor device when the free-wheeling diode built in therein is conducting and making the properties of the positive pulse depend upon the results of said measuring.

10. The method according to claim 9, further comprising the steps of measuring the voltage across each free-wheeling diode as said parameter.

11. The method according to claim 9, further comprising the steps of controlling the amount of charge stored in the respective free-wheeling diode at the moment the respective free-wheeling diode is turned off by selecting the delay between the end of said positive pulse and the turn-off of the free-wheeling diode.

12. The method according to claim 9, wherein said control of the amount of charge stored in the respective free-wheeling diode is carried out so as to minimize a possible deviation of the voltage across the respective free-wheeling diode from an average voltage across the free-wheeling diodes when turned-off for equal voltage sharing among the free-wheeling diodes.

13. The voltage converting apparatus according to claim 2, wherein said arrangement is configured to control the charge stored in the respective free-wheeling diode at the moment the respective free-wheeling diode is turned-off by selecting the delay between the end of said positive pulse and the turn-off of the free-wheeling diode.

14. The voltage converting apparatus according to claim 2, wherein the semiconductor devices thereof are Reverse Conducting Insulated Gate Bipolar Transistors (RC-IGBTs).

15. The voltage converting apparatus according to claim 3, wherein the semiconductor devices thereof are Reverse Conducting Insulated Gate Bipolar Transistors (RC-IGBTs).

16. The voltage converting apparatus according to claim 2, wherein the voltage converting apparatus is a voltage Source converter having at least one phase leg formed by a said series connection of switching elements.

17. The voltage converting apparatus according to claim 3, wherein the voltage converting apparatus is a voltage Source converter having at least one phase leg formed by a said series connection of switching elements.

18. The voltage converting apparatus according to claim 4, wherein the voltage converting apparatus is a voltage Source converter having at least one phase leg formed by a said series connection of switching elements.

19. The voltage converting apparatus according to claim 6, wherein the direct voltage across said opposite ends of said series connection is 1 kV-1200 kV, 10 kV-1200 kV or 100 kV-1200 kV.

20. The voltage converting apparatus according to claim 6, wherein said opposite ends of said series connection are connected to a direct voltage network for transmit-ting High Voltage Direct Current (HVDC) and the alternating voltage side is connected to an alternating voltage phase line belonging to an alternating voltage network.

* * * * *